(12) United States Patent
Parris (10) Patent No.: US 7,298,171 B2
(45) Date of Patent: Nov. 20, 2007

(54) LAYOUT AREA EFFICIENT, HIGH SPEED, DYNAMIC MULTI-INPUT EXCLUSIVE OR (XOR) AND EXCLUSIVE NOR (XNOR) LOGIC GATE CIRCUIT DESIGNS FOR INTEGRATED CIRCUIT DEVICES

(75) Inventor: Michael C. Parris, Colorado Springs, CO (US)

(73) Assignees: United Memories, Inc., Colorado Springs, CO (US); Sony Corporation, Tokyo (JP)

( * ) Notice: Subject to any disclaimer, the term of this patent is extended or adjusted under 35 U.S.C. 154(b) by 183 days.

(21) Appl. No.: 11/177,563

(22) Filed: Jul. 8, 2005

(65) Prior Publication Data

US 2007/0008014 A1    Jan. 11, 2007

(51) Int. Cl.
*G06F 7/50* (2006.01)
*H03K 19/21* (2006.01)

(52) U.S. Cl. .................. 326/55; 326/112; 326/96
(58) Field of Classification Search .................. 326/52, 326/54, 55
See application file for complete search history.

(56) References Cited

U.S. PATENT DOCUMENTS

| | | | |
|---|---|---|---|
| 4,570,084 A | 2/1986 | Griffin et al. | |
| 4,645,954 A * | 2/1987 | Schuster | 326/73 |
| 4,749,886 A | 6/1988 | Hedayati | |
| 4,888,499 A | 12/1989 | Sanwo et al. | |
| 5,134,616 A | 7/1992 | Barth, Jr. et al. | |
| 5,399,921 A * | 3/1995 | Dobbelaere | 326/113 |
| 5,859,548 A * | 1/1999 | Kong | 326/113 |
| 5,936,427 A | 8/1999 | Tsujihashi | |

FOREIGN PATENT DOCUMENTS

| | | |
|---|---|---|
| JP | 61-264820 | 11/1986 |
| JP | 03-262317 | 11/1991 |
| JP | 08-123665 | 5/1996 |

OTHER PUBLICATIONS

Chu, Kan M. and Pulfrey, David I., Design Procedures for Differential Cascode Voltage Switch Circuits, IEEE Journal of Solid-State Circuits, vol. SC-21, No. 6, Dec. 1986, pgs. 1082-1087.

* cited by examiner

*Primary Examiner*—James H. Cho
*Assistant Examiner*—Crystal L Hammond
(74) *Attorney, Agent, or Firm*—William J. Kubida; Peter J. Meza; Hogan & Hartson LLP (57) ABSTRACT

A layout area efficient, high speed, dynamic multi-input exclusive OR (XOR) and exclusive NOR (XNOR) logic gate circuit design of especial utility with respect to integrated circuit devices. The logic gate design disclosed herein utilizes fewer transistors than traditional static designs and, therefore, requires a smaller amount of integrated circuit layout area while nevertheless affording higher speed operating performance than that exhibited in existing conventional circuits.

26 Claims, 6 Drawing Sheets

Fig. 1A
*Prior Art*

| A | B | Q |
|---|---|---|
| 0 | 0 | 0 |
| 0 | 1 | 1 |
| 1 | 0 | 1 |
| 1 | 1 | 0 |

| A | B | C | Q |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

LAYOUT AREA EFFICIENT, HIGH SPEED, DYNAMIC MULTI-INPUT EXCLUSIVE OR (XOR) AND EXCLUSIVE NOR (XNOR) LOGIC GATE CIRCUIT DESIGNS FOR INTEGRATED CIRCUIT DEVICES

BACKGROUND OF THE INVENTION

The present invention relates, in general, to the field of integrated circuit logic circuits and devices. More particularly, the present invention relates to layout area efficient, high speed, dynamic multi-input exclusive OR (XOR) and exclusive NOR (XNOR) logic gate circuit designs of especial utility with respect to integrated circuit devices.

Error correction circuitry (ECC) and other types of logic functions that make use of parity require XOR and the XNOR logic gate functions. These XOR and XNOR gates are more difficult to implement with complementary metal oxide semiconductor (CMOS) technology than standard NAND and NOR logic gates, particularly when considering multi-input gates having more than two inputs. Conventional static three-input XOR circuits are generally slow and require many transistors. Representative implementations of various XOR logic gates are shown, for example, in U.S. Pat. No. 4,749,886 issued Jun. 7, 1988 for "Reduced Parallel Exclusive OR and Exclusive NOR Gate", U.S. Pat. No. 4,888,499 issued Dec. 19, 1989 for "Three Input Exclusive OR-NOR Gate Circuit' and U.S. Pat. No. 5,936,427 issued Aug. 10, 1999 for "Three-Input Exclusive NOR Circuit". Examples of conventional four-input XOR circuits are shown, for example, in U.S. Pat. No. 4,570,084 issued Feb. 11, 1986 for "Clocked Differential Cascode Voltage Switch Logic Systems" and U.S. Pat. No. 5,134,616 issued Jul. 28, 1996 for "Dynamic RAM with On-Chip ECC and Optimized Bit and Word Redundancy". The larger number input XOR gates are important in order to reduce stages in wide-word ECC circuit blocks.

SUMMARY OF THE INVENTION

Disclosed herein is a dynamic, multi-input XOR and XNOR logic gate circuit design (as exemplified by representative three and four-input embodiments) utilizing fewer transistors than traditional static designs and, therefore, requiring a smaller amount of integrated circuit layout area while nevertheless affording higher speed operating performance than that exhibited by existing conventional circuits.

Particularly disclosed herein is a logic gate comprising a clocked latch circuit selectively couplable between a supply voltage source and a reference voltage source in response to a first clock signal. The latch circuit has first and second nodes thereof respectively coupled to first and second complementary logic gate outputs. First and second clocked strings of N number of series coupled transistors are selectively couplable between the supply voltage source and the reference voltage source in response to a second clock signal with a selected terminal of each of the N transistors defining first through Nth intermediate nodes therebetween. The logic circuit further comprises N additional transistors with each of the N additional transistors being coupled between one of the intermediate nodes of the first and second clocked strings and a next higher number intermediate node on an opposite one of the first and second clocked strings. The Nth intermediate node of the first and second clocked strings are also selectively couplable to the first and second nodes of said clocked latch circuit in response to the second clock signal and the control terminals of each of the first and second clocked strings of N series coupled transistors and the N additional transistors define logic inputs to the logic gate.

Also particularly disclosed herein is an XOR/XNOR logic gate which comprises a plurality of logic signal inputs and first and second complementary logic signal outputs together with a clocked latch circuit having first and second nodes thereof coupled to the first and second complementary logic signal outputs. The clocked latch circuit is clocked by a first clock signal. The logic gate further comprises a plurality of transistors, with each transistor coupled to receive one of the plurality of logic signal inputs at a control terminal thereof. The plurality of transistors are coupled to first and second intermediate nodes of the logic gate and selectively couplable to the first and second nodes of the clocked latch circuit in response to a second clock signal having an opposite phase with respect to the first clock signal.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figures 1A, 1B, 2A:
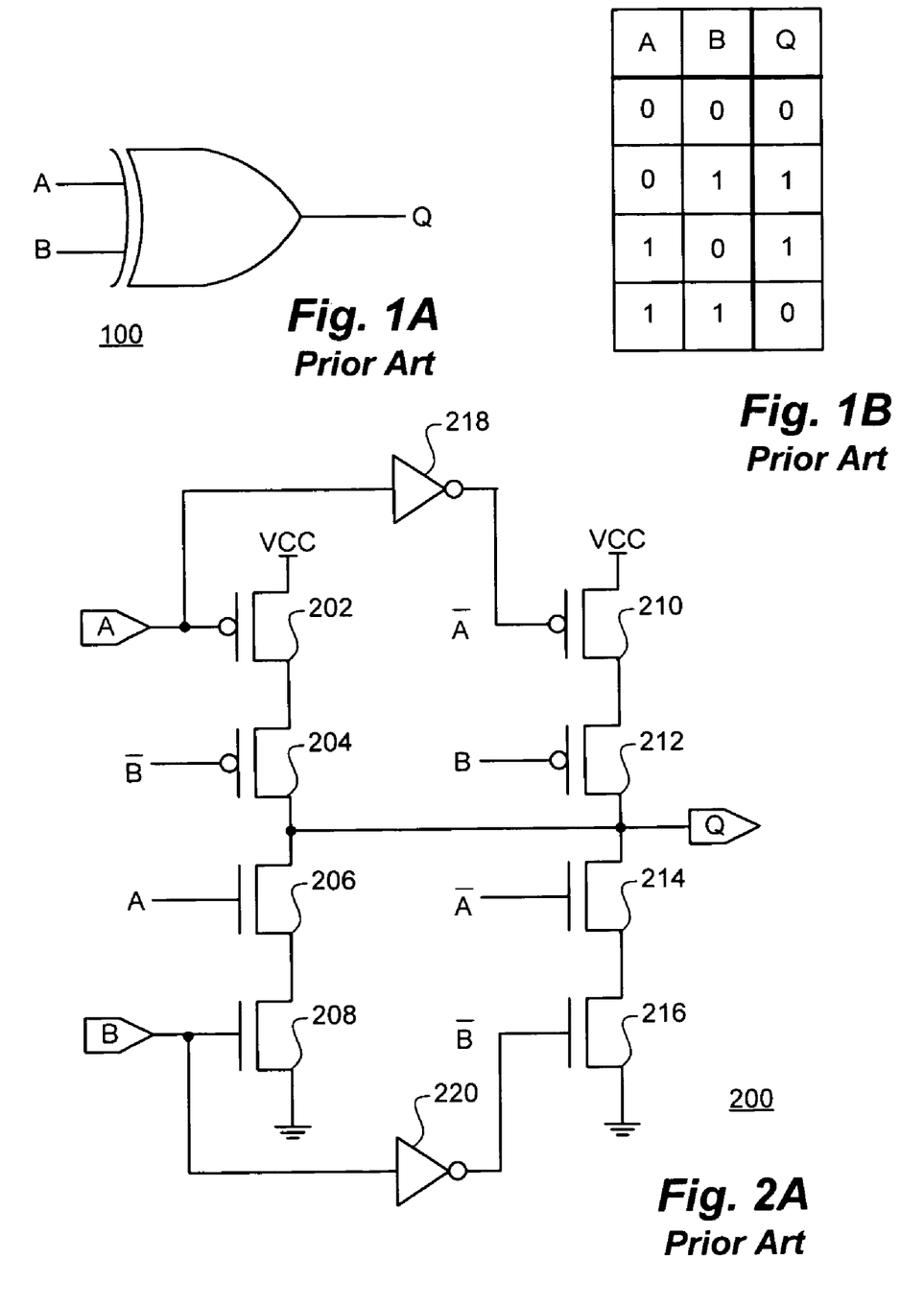
FIGS. 1A and 1B are, respectively, a conventional representation of a two-input XOR gate and a truth table indicative of its functionality.
FIGS. 2A through 2D are schematic, device level illustrations of various implementations of conventional static two-input XOR gates.

With reference now to FIGS. 1A and 1B, a conventional representation of a two-input XOR gate 100 is shown together with a truth table indicative of its functionality and the output "Q" provided for the various permutations of the two inputs signals on leads "A" and "B".

With reference additionally now to FIGS. 2A through 2D, schematic, device level illustrations of various implementations of conventional two-input XOR gates are shown. None of the designs illustrated lend themselves particularly well to more than two-input XOR devices.

With particular reference to FIG. 2A, the two-input XOR gate 200 comprises two series connected strings of transistors coupled between a supply voltage source (e.g. VCC) and a reference voltage source (e.g. VSS or circuit ground). A first string of series connected P-channel transistors 202 and 204 is connected in series with N-channel transistors 206 and 208 between VCC and circuit ground. In like manner, a second string of series connected P-channel transistors 210 and 212 is also connected in series with N-channel transistors 214 and 216 between VCC and circuit ground. The "A" input is coupled to the gate of transistor 202 and the gate of transistor 206 while the "B" input is coupled to the gate of transistor 208 and the gate of transistor 212. The complementary signal /A (or "A bar") is coupled through an inverter to the gate of transistor 210 and also supplied to the gate of transistors 214. Similarly, the complementary signal /B (or "B bar") is coupled through an inverter 220 to the gate of transistor 216 and also applied to the gate of transistor 204.

Figure 2B:
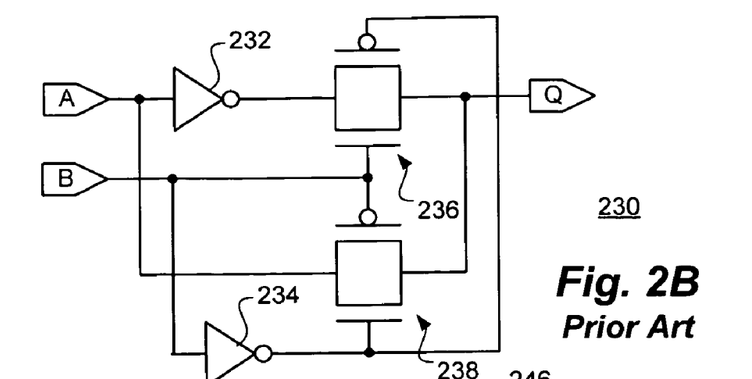

With particular reference to FIG. 2B, the two-input XOR gate 230 comprises a pair of inverters 232 and 234 having their input respectively coupled to the "A" and "B" inputs. The output of the inverter 232 is coupled to the output "Q" through a CMOS pass gate 236 while the "A" input itself is coupled to the "Q" output through another CMOS pass gate 238. The "B" input controls the operation of the pass gates 236 and 238 both directly and through the inversion of its signal by means of inverter 234.

Figure 2C:
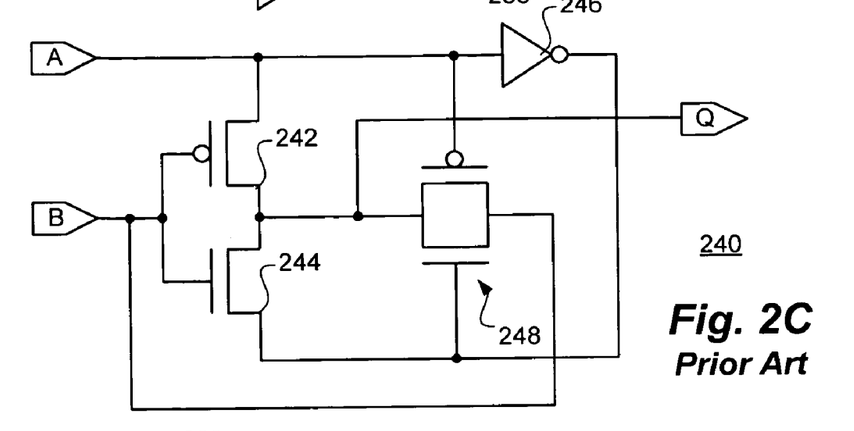

With particular reference to FIG. 2C, the two-input XOR gate 240 comprises a series connected P-channel transistor 242 and N-channel transistor 244 in association with an inverter 246 and a CMOS pass gate 248. The "A" input is coupled to the source terminal of transistor 242 as well as to one control terminal of the CMOS pass gate 248 and the input of the inverter 246. The "B" input is coupled to the common connected gate terminals of the transistors 242 and 244 as well as to the output of the CMOS pass gate 248. The "Q" output is coupled to the input of the CMOS pass gate 248 and the common connected drain terminals of the transistors 242 and 244.

Figure 2D:
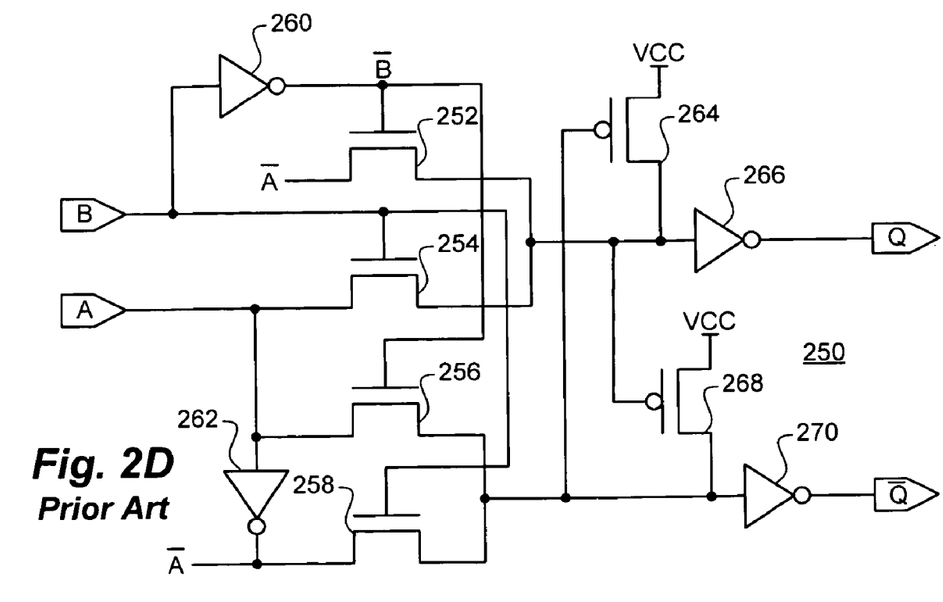

With particular reference to FIG. 2D, the two input XOR gate 250 comprises a number of N-channel transistors 252, 254, 256 and 258 as shown. The "A" input is coupled to one terminal of transistors 254 and 256 as well as to one terminal of transistor 258 as signal /A through inverter 262, which signal is also supplied to one terminal of transistor 252. The "B" input of XOR gate 259 is supplied to the gate terminals of transistors 254 and 258 while its complement, /B is supplied through inverter 260 to the gate terminals of transistors 252 and 256.

P-channel transistor 264 is coupled between VCC and the common connected outputs of transistors 252 and 254, which is also coupled to the gate terminal of another P-channel transistor 268. Similarly, P-channel transistor 268 is coupled between VCC and the common connected outputs of transistors 256 and 258, which is also coupled to the gate terminal of the P-channel transistor 264. The common connected outputs of transistors 252 and 254 is provided through an inverter 266 as the "Q" output while the common connected outputs of transistors 256 and 258 is provided through another inverter 270 as the "/Q", or XNOR output.

Figure 3A:
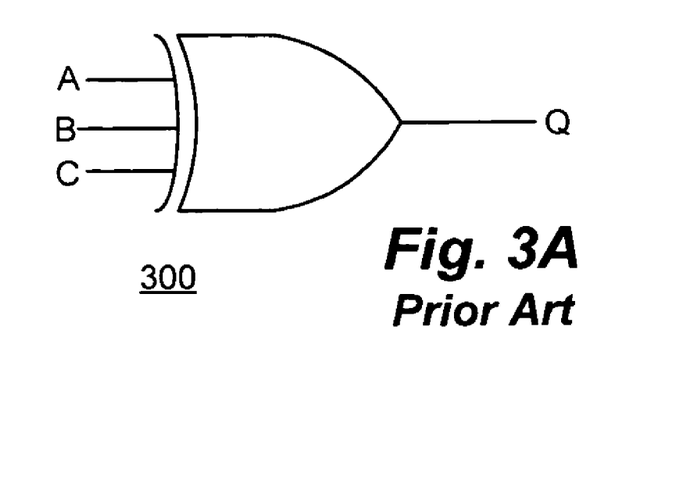
FIGS. 3A and 3B are, respectively, a conventional representation of a three-input XOR gate and a truth table indicative of its functionality.
Figure 3B:
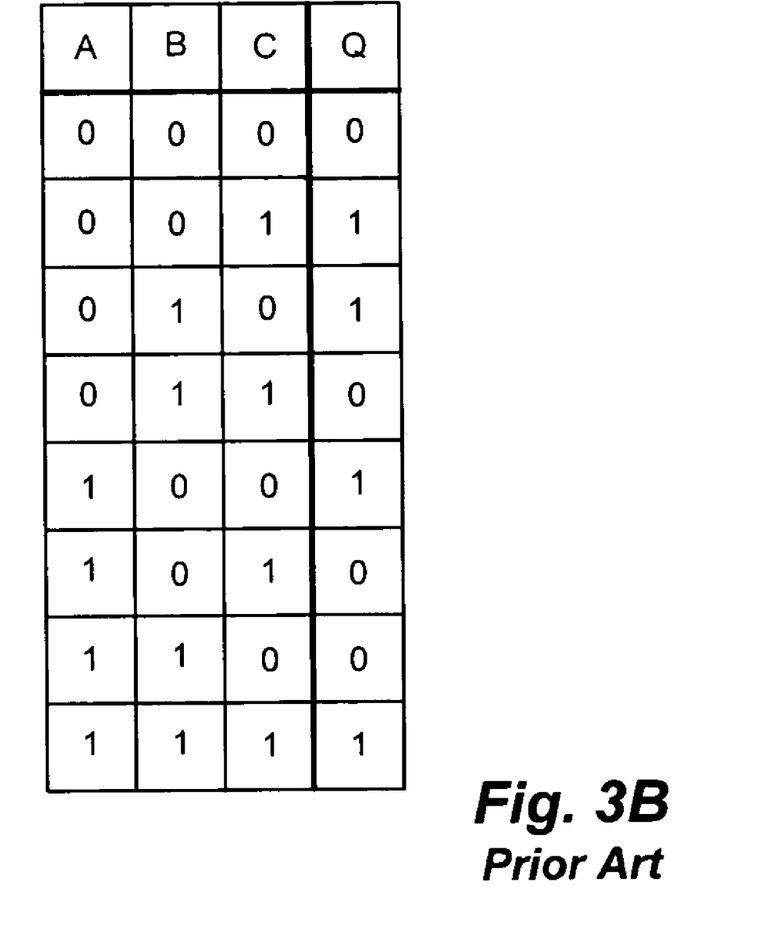

With reference additionally now to FIGS. 3A and 3B a conventional representation of a three-input XOR gate 300 is shown together with a truth table indicative of its functionality and the output "Q" provided for the various permutations of the three inputs signals on leads "A", "B" and "C".

Figure 4:
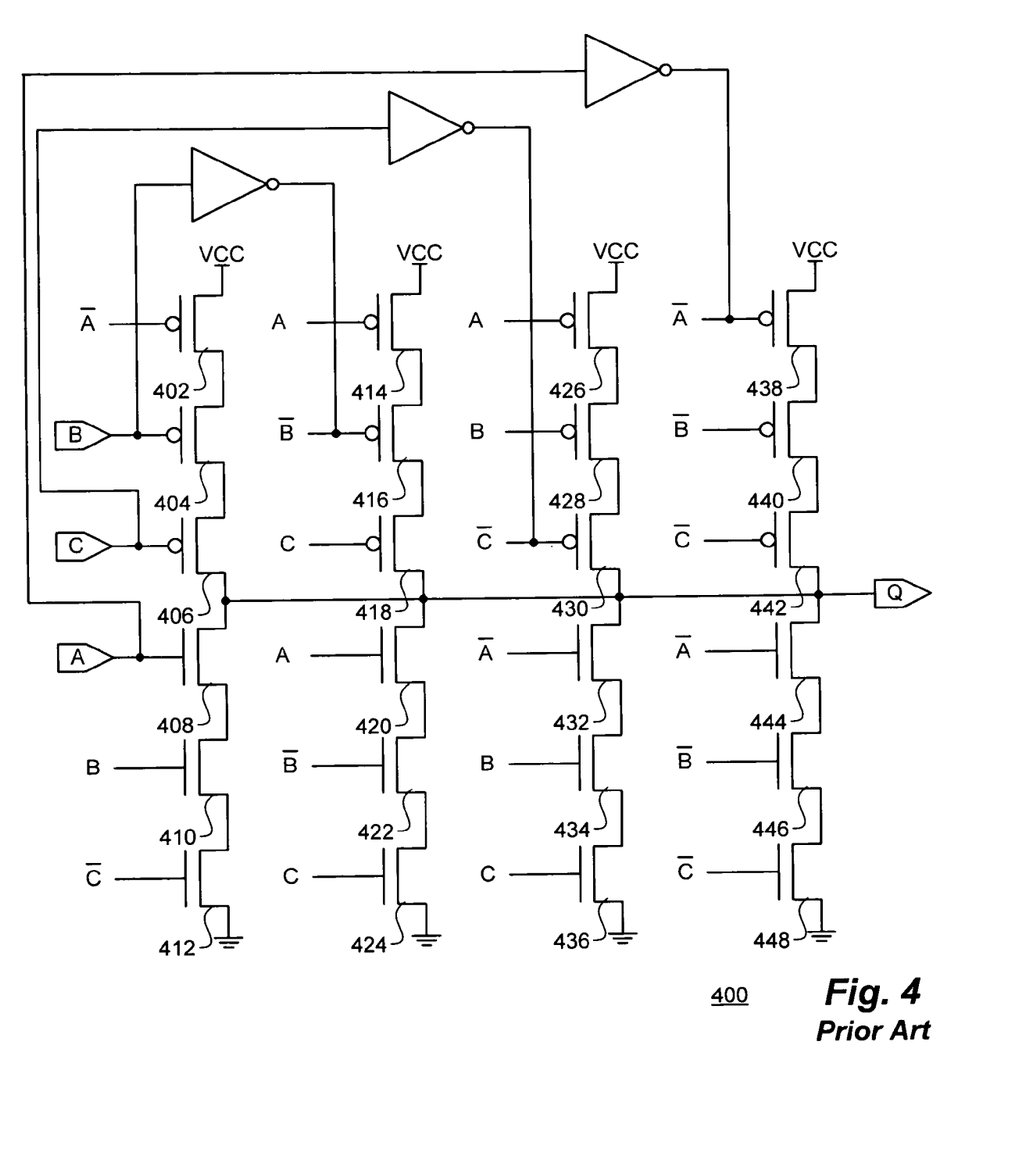
FIG. 4 is a conceptual representation of a static three-input XOR gate implemented in a manner analogous to the two-input XOR gate of FIG. 2A utilizing conventional design techniques.

With reference additionally now to FIG. 4, a conceptual representation of a static three-input XOR gate 400 is shown as implemented in a manner analogous to the two-input XOR gate 200 of FIG. 2A utilizing conventional design techniques. The XOR gate 400 comprises four series connected strings of transistors, as shown. A first string comprises series connected P-channel transistors 402, 404 and 406 with series connected N-channel transistors 408, 410 and 412 all connected together in series between VCC and circuit ground. In like manner, a second string comprises series connected P-channel transistors 414, 416 and 418 with series connected N-channel transistors 420, 422 and 424 also connected together in series between VCC and circuit ground. Similarly, a third string comprises series connected P-channel transistors 426, 428 and 430 with series connected N-channel transistors 432, 434 and 436 connected together in series between VCC and circuit ground. Finally, a fourth string comprises series connected P-channel transistors 438, 440 and 442 with series connected N-channel transistors 444, 446 and 448 again connected together in series between VCC and circuit ground.

The "Q" output is taken at the common drain terminals of transistors 406, 418, 430, 442, 408, 420, 432 and 444. The "A" input is supplied to the gate terminals of transistors 408, 414, 420 and 426 and its complement, "/A", is supplied to the gate terminals of transistors 402, 432, 438 and 444. The "B" input is supplied to the gate terminals of transistors 404, 410, 428 and 434 while the complementary "/B" signal is supplied to the gate terminals of transistors 416, 422, 440 and 446. The "C" input is supplied to the gate terminals of transistors 406, 418, 424 and 436 while the complementary "/C" signal is supplied to the gate terminals of transistors 412, 430, 442 and 448. A representative number of inverters for furnishing the "/A", "/B" and "/C" input signals are also illustrated. As is apparent, the number of transistors required to provide a conventional three-input XOR gate 400 soon grows to be unreasonably large, and possibly prohibitively so for conventional static designs of four or more inputs.

Figure 5:
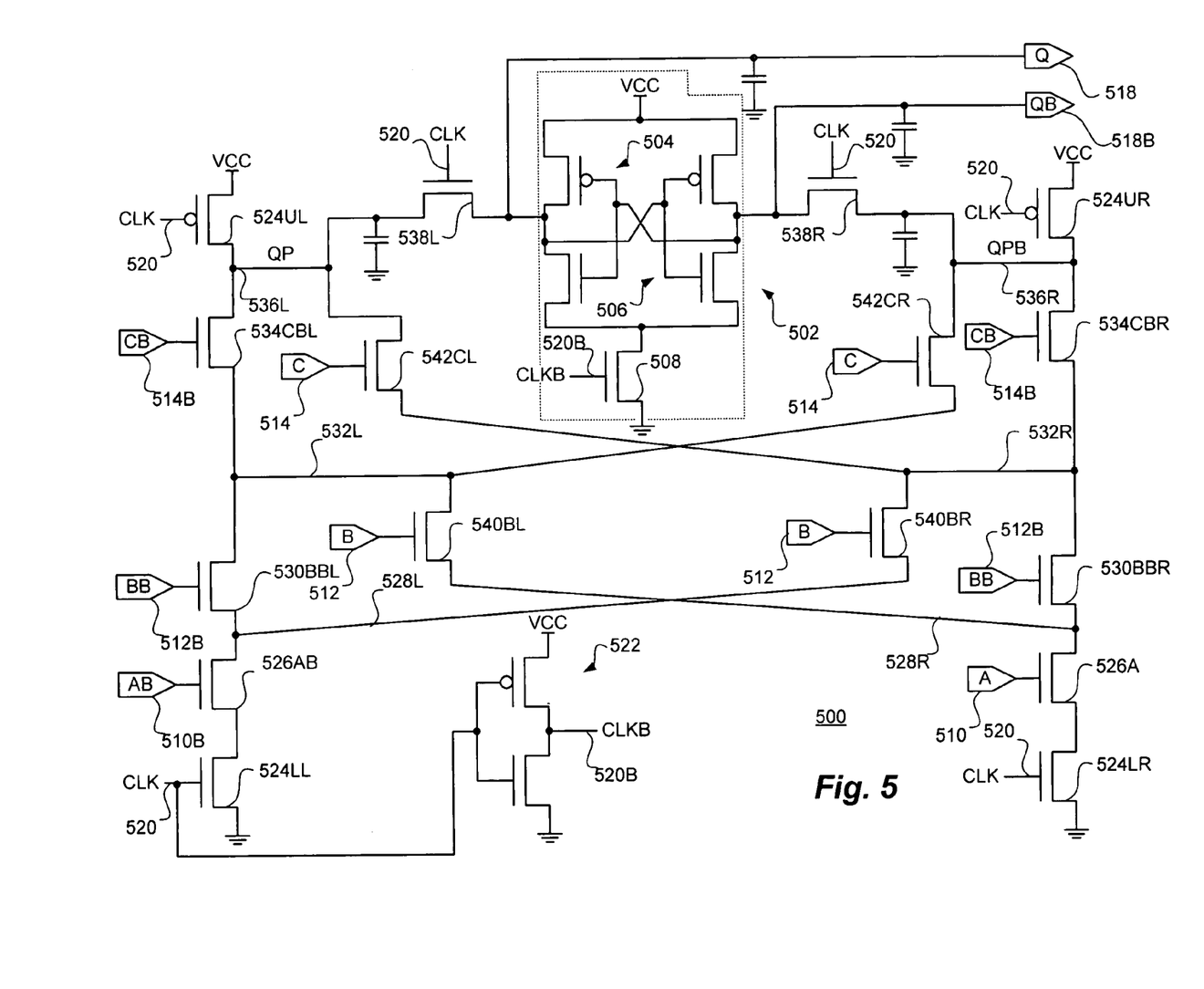
FIG. 5 is a schematic diagram of a dynamic three-input XOR/XNOR gate in accordance with a particular implementation of the present invention.

With reference additionally now to FIG. 5, a schematic diagram of a dynamic three-input XOR/XNOR logic gate 500 in accordance with a particular implementation of the present invention is shown. The logic gate comprises, in pertinent part, a clocked latch circuit 502 comprising a pair of cross-coupled CMOS inverters 504 and 506 coupled to VCC and selectively couplable to circuit ground by an N-channel transistor 508. First and second nodes of the latch circuit 502 provide respective "Q" (XOR) and complementary "QB" (XNOR) outputs on lines 518 and 518B. Inputs to the logic gate 500 comprise "A" input 510, "B" input 512 and "C" input 514 as well as their complements, "AB" input 510B, "BB" input 512B and "CB" input 514B.

The logic gate 500 is clocked by means of a clock (CLK) signal coupled to line 520 and its complement "CLKB" derived, for example, at the output of a CMOS inverter 522 on line 520B. The CLKB signal is supplied to the gate terminal of transistor 508.

The logic gate 500 comprises first and second strings of series coupled N-channel transistors, with the first string including transistors 526AB, 530BBL and 534CBL while the second string comprises transistors 526A, 530BBR and 534CBR. The first string is selectively couplable to VCC through the enabling of P-channel transistor 524UL and to circuit ground through N-channel transistor 524LL, both of which receive the CLK signal at their gate terminal. Similarly, the second string is selectively couplable to VCC through the enabling of P-channel transistor 524UR and to circuit ground through N-channel transistor 524LR, both of which also receive the CLK signal at their gate terminal.

An N-channel transistor 540BL has its source terminal coupled to a first intermediate node 528R at the drain of transistor 526A and its drain terminal coupled to a second intermediate node 532L at the drain of transistor 530BBL. In like manner, another N-channel transistor 540BR has its source terminal coupled to a first intermediate node 528L at the drain of transistor 526AB and its drain terminal coupled to a second intermediate node 532R at the drain of transistor 530BBR. Further, an N-channel transistor 542CL has its source terminal coupled to the second intermediate node 532R at the drain of transistor 530BBR and its drain terminal coupled to a third intermediate node 536L ("QP") at the drain of transistor 534CBL. In like manner, another N-channel transistor 542CR has its source terminal coupled to the second intermediate node 532L at the drain of transistor 530BBL and its drain terminal coupled to a third intermediate node 536R ("QPB") at the drain of transistor 534CBR. The first and second nodes of the latch circuit 502 are selectively couplable to the QP and QPB nodes 536L and 536R through N-channel transistors 538L and 538R respectively, which receive the CLK signal at their gate terminals.

As illustrated the gate of transistor 526A receives the "A" input signal on line 510, the gate terminals of transistors 540BL and 540BR receive the "B" input signal on line 512, while the gate terminals of transistors 542CL and 542CR receive the "C" input signal on line 514. The complementary "AB" signal is supplied to the gate of transistor 526AB on line 510B, the complementary "BB" signal is supplied to the gate of transistors 530BBL and 530BBR on line 512B while the complementary "CB" signal is supplied to the gate of transistors 534CBL and 534CBR on line 514B.

Functionally, when the CLK signal is "low", the "QP" 536L and "QPB" 536R nodes are precharged "high", while outputs "Q" 518 and "QB" 518B are disconnected and allowed to remain latched at their previous levels. When the CLK signal transitions to a logic level "high", inputs "A" 510, "B" 512, "C" 514, "AB" 510B, "BB" 512B and "CB" 514B are evaluated and either node "QP" 536L or "QPB" 536R will go "low". Since pass gate transistors 538L and 538R are now "on" and coupled to nodes 536L and 536R, this information is transferred to the "Q" 518 and "QB" 518B nodes when the CLK transitions to logic level "low" again, that is, when the complementary CLKB signal goes "high". The output "Q" and "QB" levels are sensed and amplified through the latch circuit 502 devices.

As previously described, at this time node "QP" 536L and "QPB" 536R are precharged and disconnected from the outputs "Q" 518 and "QB" 518B. The series coupled N-channel transistors 534CBL, 540BL, 530BBL, 526AB, 542CR, 530BBR, 540BR, 534CBR, 526A and 542CL are configured to pull down node "QP" 536L or "QPB" 536R when the CLK signal is "high" according to the three input XOR truth table shown in FIG. 3B. It should be noted that the logic gate 500 performs both an XOR and XNOR function on the three inputs "A" 510, "B" 512 and "C" 514 since both the "Q" 518 and "QB" 518B outputs are made available.

Figure 6:
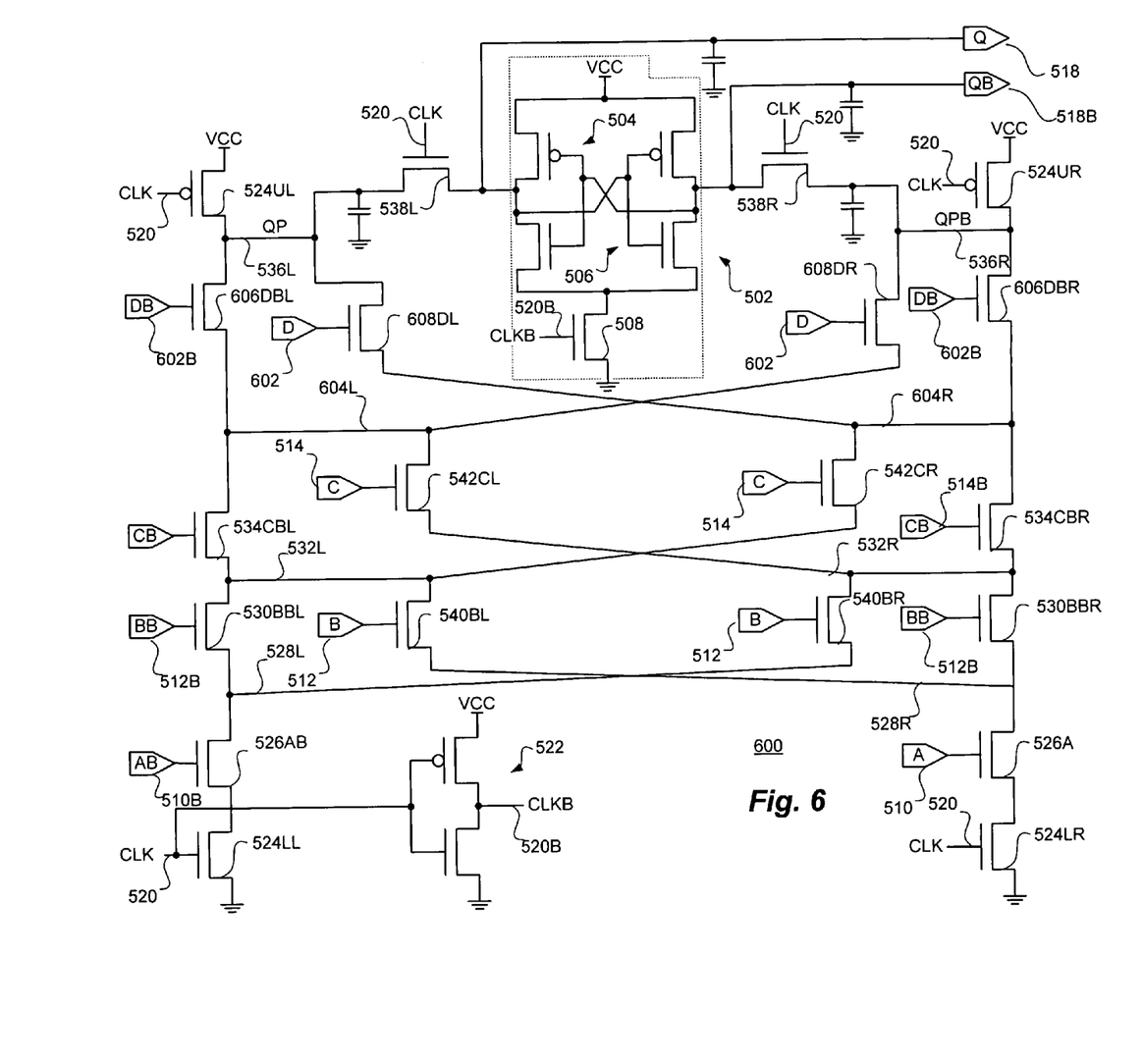
FIG. 6 is a schematic diagram of a dynamic four-input XOR/XNOR gate in accordance with a further implementation of the present invention and illustrative of how the concepts disclosed herein can be utilized to implement an N-input XOR/XNOR gate.

With reference additionally now to FIG. 6, a schematic diagram of a dynamic four-input XOR/XNOR logic gate 600 in accordance with a further implementation of the present invention is shown. In this illustration, like structure to that previously described with respect to the three-input XOR/XNOR gate 500 of FIG. 5 is like numbered and the foregoing description thereof shall suffice herefor.

Utilizing the principles of the present invention, a four-input XOR/XNOR logic gate 600 can be readily provided through the addition of a "D" input 602 at the gate of additional N-channel transistors 608DL and 608DR and a complementary "DB" input 602B at the gate of additional N-channel transistors 606DBL and 606DBR added to the first and second transistor strings as shown. The transistor 608DR is coupled to an intermediate node 604L at the drain of transistor 534CBL and the "QPQ" node 536R. Similarly, the transistor 608DL is coupled to node 604R at the drain of transistor 534CBR and the "QP" node 536L. Transistor 606DBL is placed in series between transistors 524UL and transistor 534CBL while transistor 606DBR is placed in series between transistors 523UR and 534CBR. The four-input XOR/XNOR logic gate 600 shown operates in a manner analogous to the three-input XOR/XNOR logic gate 500 previously described.

It should be further noted that, while a representative three-input XOR/XNOR logic gate 500 (FIG. 5) and a four-input XOR/XNOR logic gate 600 (FIG. 6) have been illustrated, the principles of the present invention are likewise applicable to five-input (and more) multi-input XOR/XNOR gates. For example, the four-input XOR/XNOR logic gate 600 can be readily expanded to a five-input gate by breaking the connections between the drain terminals of transistors 606DBL and 608DL with node "QP" 536L and the connections between the drain terminals of transistors 606DBR and 608DR with node "QPB" 536R. An additional N-channel transistor can then be placed in series between the drain terminal of transistor 606DBL with node "QP" 536L while a similar device is placed in series between the drain terminal of transistor 606DBR and node "QPB" 536R. The signal "FB" would then be input to the gate terminals of these devices. Another N-channel transistor would then be placed in series between the drain of transistor 608DR and node "QP" 536L while a similar device is place in series between the drain of transistor 608DL and node "QPB" 536R. The signal "F" would then be input to the gate terminals of these devices. Multi-input XOR/XNOR gates having even more inputs can be readily provided in the same manner.

While there have been described above the principles of the present invention in conjunction with specific circuit implementations, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A logic gate comprising:
   a clocked latch circuit selectively couplable between a supply voltage source and a reference voltage source in response to a first clock signal, said latch circuit having first and second nodes thereof respectively coupled to first and second complementary logic gate outputs;
   first and second clocked strings of N number of series coupled transistors selectively couplable between said supply voltage source and said reference voltage source in response to a second clock signal, a selected terminal of each of said N transistors defining first through Nth intermediate nodes therebetween;

N additional transistors, each of said N additional transistors being coupled between one of said intermediate nodes of said first and second clocked strings and a next higher number intermediate node on an opposite one of said first and second clocked strings, said Nth intermediate node of said first and second clocked strings also being selectively couplable to said first and second nodes of said clocked latch circuit in response to said second clock signal and wherein control terminals of each of said first and second clocked strings of N series coupled transistors and said N additional transistors define logic inputs to said logic gate, wherein said first and second clocked strings of N number of series coupled transistors are selectively couplable to said supply voltage source in response to a signal supplied to a control terminal of a transistor coupled in series with each of said first and second clocked strings and said supply voltage source.

2. The logic gate of claim 1 wherein said clocked latch circuit comprises cross-coupled inverters.

3. The logic gate of claim 2 wherein said cross-coupled inverters comprise CMOS inverters.

4. The logic gate of claim 1 wherein said first and second clock signals are complementary clock signals.

5. The logic gate of claim 1 wherein said clocked latch circuit is selectively couplable between said supply voltage source and said reference voltage source in response to a signal supplied to a control terminal of a transistor coupled in series with said clocked latch circuit and said reference voltage source.

6. The logic gate of claim 5 wherein said transistor coupled in series with said clocked latch circuit and said reference voltage source comprises an N-channel device.

7. The logic gate of claim 1 wherein said transistor coupled in series with each of said first and second clocked strings and said supply voltage source comprises a P-channel device.

8. The logic gate of claim 1 wherein said first and second clocked strings of N number of series coupled transistors are selectively couplable to said reference voltage source in response to a signal supplied to a control terminal of a transistor coupled in series with each of said first and second clocked strings and said reference voltage source.

9. The logic gate of claim 8 wherein said transistor coupled in series with each of said first and second clocked strings and said reference voltage source comprises an N-channel device.

10. The logic gate of claim 1 wherein said Nth intermediate nodes of said first and second clocked strings are selectively couplable to said first and second nodes of said clocked latch circuit in response to a signal supplied to a control terminal of a transistor coupled between said Nth intermediate node of said first clocked string and said first logic gate output and a signal supplied to a control terminal of another transistor coupled between said Nth intermediate node of said second clocked string and said second logic gate output.

11. The logic gate of claim 10 wherein said transistor coupled between said Nth intermediate node of said first clocked string and said first node of said clocked latch circuit and said another transistor coupled between said Nth intermediate node of said second clocked string and said second node of said clocked latch circuit comprise N-channel devices.

12. The logic gate of claim 1 wherein said first and second complementary logic gate outputs represent XOR and XNOR outputs of said logic inputs to said logic gate.

13. The logic gate of claim 1 wherein N is greater than two.

14. A logic gate comprising:

a clocked latch circuit selectively couplable between a supply voltage source and a reference voltage source in response to a first clock signal, said latch circuit having first and second nodes thereof respectively coupled to first and second complementary logic gate outputs;

first and second clocked strings of N number of series coupled transistors selectively couplable between said supply voltage source and said reference voltage source in response to a second clock signal, a selected terminal of each of said N transistors defining first through Nth intermediate nodes therebetween;

N additional transistors, each of said N additional transistors being coupled between one of said intermediate nodes of said first and second clocked strings and a next higher number intermediate node on an opposite one of said first and second clocked strings, said Nth intermediate node of said first and second clocked strings also being selectively couplable to said first and second nodes of said clocked latch circuit in response to said second clock signal and wherein control terminals of each of said first and second clocked strings of N series coupled transistors and said N additional transistors define logic inputs to said logic gate, wherein said Nth intermediate nodes of said first and second clocked strings are selectively couplable to said first and second nodes of said clocked latch circuit in response to a signal supplied to a control terminal of a transistor coupled between said Nth intermediate node of said first clocked string and said first logic gate output and a signal supplied to a control terminal of another transistor coupled between said Nth intermediate node of said second clocked string and said second logic gate output.

15. The logic gate of claim 14 wherein said clocked latch circuit comprises cross-coupled inverters.

16. The logic gate of claim 15 wherein said cross-coupled inverters comprise CMOS inverters.

17. The logic gate of claim 14 wherein said first and second clock signals are complementary clock signals.

18. The logic gate of claim 14 wherein said clocked latch circuit is selectively couplable between said supply voltage source and said reference voltage source in response to a signal supplied to a control terminal of a transistor coupled in series with said clocked latch circuit and said reference voltage source.

19. The logic gate of claim 18 wherein said transistor coupled in series with said clocked latch circuit and said reference voltage source comprises an N-channel device.

20. The logic gate of claim 14 wherein said first and second clocked strings of N number of series coupled transistors are selectively couplable to said supply voltage source in response to a signal supplied to a control terminal of a transistor coupled in series with each of said first and second clocked strings and said supply voltage source.

21. The logic gate of claim 20 wherein said transistor coupled in series with each of said first and second clocked strings and said supply voltage source comprises a P-channel device.

22. The logic gate of claim 14 wherein said first and second clocked strings of N number of series coupled transistors are selectively couplable to said reference voltage source in response to a signal supplied to a control terminal of a transistor coupled in series with each of said first and second clocked strings and said reference voltage source.

23. The logic gate of claim 22 wherein said transistor coupled in series with each of said first and second clocked strings and said reference voltage source comprises an N-channel device.

24. The logic gate of claim 14 wherein said transistor coupled between said Nth intermediate node of said first clocked string and said first node of said clocked latch circuit and said another transistor coupled between said Nth intermediate node of said second clocked string and said second node of said clocked latch circuit comprise N-channel devices.

25. The logic gate of claim 14 wherein said first and second complementary logic gate outputs represent XOR and XNOR outputs of said logic inputs to said logic gate.

26. The logic gate of claim 14 wherein N is greater than two.

* * * * *